United States Patent [19]
Wilson

[11] Patent Number: 5,901,934
[45] Date of Patent: May 11, 1999

[54] RETRACTABLE SURFACE APPARATUS

[76] Inventor: Ronal E. Wilson, 403 Tiffany Trail, Richardson, Tex. 75081

[21] Appl. No.: 08/794,613

[22] Filed: Feb. 3, 1997

Related U.S. Application Data

[63] Continuation-in-part of application No. 29/048,968, Jan. 16, 1996, Pat. No. Des. 380,462, application No. 29/045,428, Oct. 19, 1995, Pat. No. Des. 392,955, and application No. 29/059,130, Aug. 22, 1996, Pat. No. Des. 398,294.

[51] Int. Cl.⁶ .................................................... H05K 5/00
[52] U.S. Cl. ...................... 248/346.01; 248/918; 361/727
[58] Field of Search .............. 248/918, 346.01, 248/346.07, 118, 118.1; 108/143; 361/683, 727, 686

[56] References Cited

U.S. PATENT DOCUMENTS

| | | | |
|---|---|---|---|
| D. 291,204 | 8/1987 | Hampshire et al. | D14/114 |
| D. 302,425 | 7/1989 | LaBudde et al. | D14/114 |
| D. 333,300 | 2/1993 | Hatcher | D14/114 |
| D. 339,799 | 9/1993 | Allen | D14/114 |
| D. 361,325 | 8/1995 | Massey | D14/114 |
| D. 364,397 | 11/1995 | Bedol | D14/114 |
| 838,786 | 12/1906 | Johnson | 108/143 |
| 3,899,982 | 8/1975 | Fetzek | 108/143 X |
| 4,595,993 | 6/1986 | Yao | 364/708 |
| 5,062,609 | 11/1991 | Hames et al. | 248/918 X |
| 5,182,698 | 1/1993 | Kobayashi et al. | 361/395 |
| 5,287,246 | 2/1994 | Sen | 361/683 |
| 5,339,213 | 8/1994 | O'Callaghan | 361/683 |
| 5,433,407 | 7/1995 | Rice | 248/118 |
| 5,443,237 | 8/1995 | Stadtmauer | 248/918 X |
| 5,490,039 | 2/1996 | Helms | 361/727 X |
| 5,556,061 | 9/1996 | Dickie | 248/918 X |
| 5,653,413 | 8/1997 | Fink | 248/918 X |
| 5,655,743 | 8/1997 | Gillis | 248/918 X |

FOREIGN PATENT DOCUMENTS

| | | |
|---|---|---|
| 2224005 | 9/1990 | Japan . |
| 5257570 | 10/1993 | Japan . |
| 6161602 | 6/1994 | Japan . |

*Primary Examiner*—James R. Brittain
*Attorney, Agent, or Firm*—Baker & McKenzie; Robert J. Ward

[57] ABSTRACT

A retractable surface apparatus (10) is provided that may be positioned on the bottom side of any device such as a portable computer (12), a keyboard, or a drawer of a computer drawer. The retractable surface apparatus (100) includes a casing (18) and a retractable surface portion (16). The casing (18) has an opening formed therein with a first end and a second end. The retractable surface portion (16) includes a top surface, a bottom surface, a first side edge, a second side edge, a front edge, and a back edge. The retractable surface portion (16) is slidably positioned within the opening of the casing (10) such that the retractable surface portion (16) is operable to extend from the opening of the casing (18) through the first end for a predetermined distance to serve as a work surface.

16 Claims, 12 Drawing Sheets

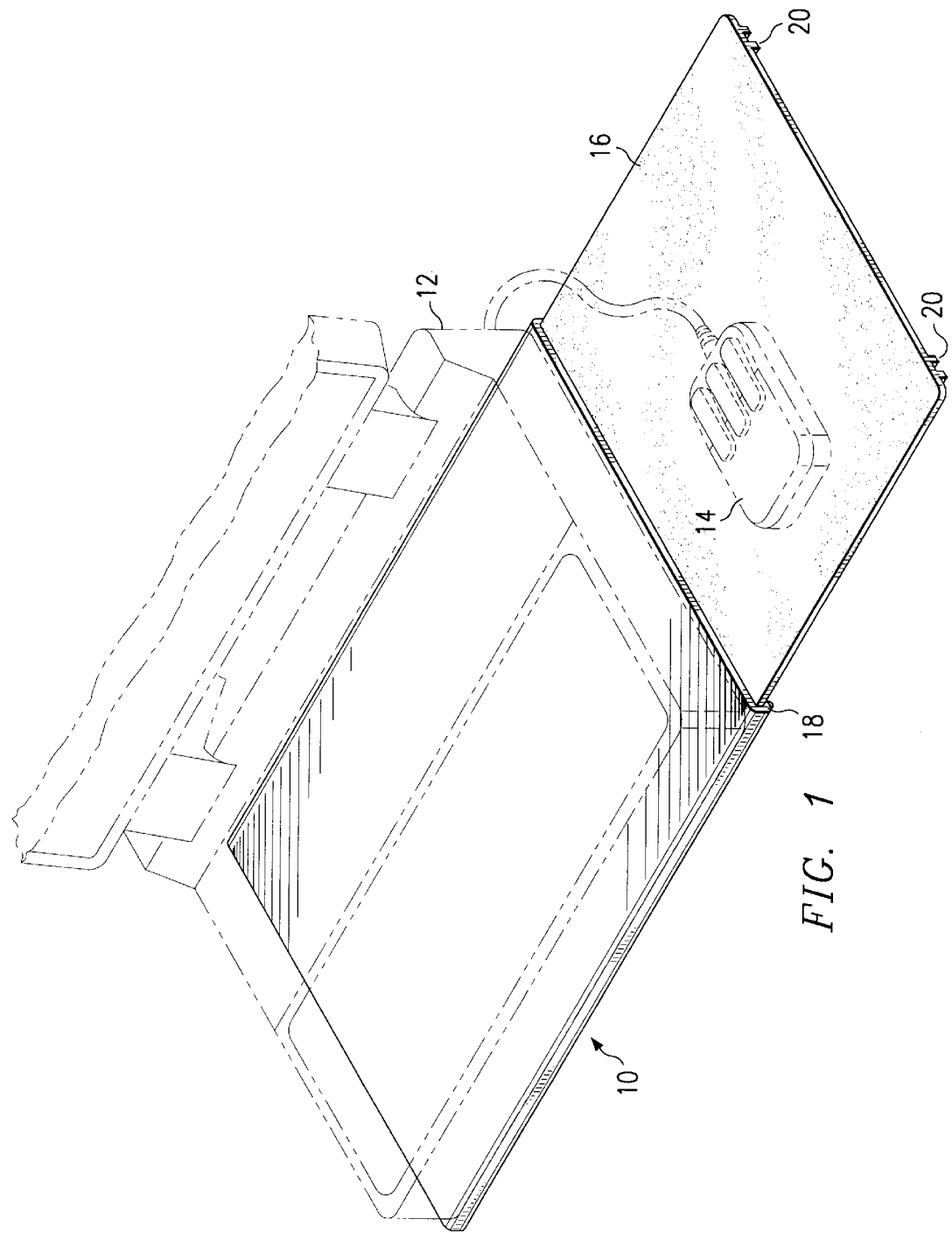

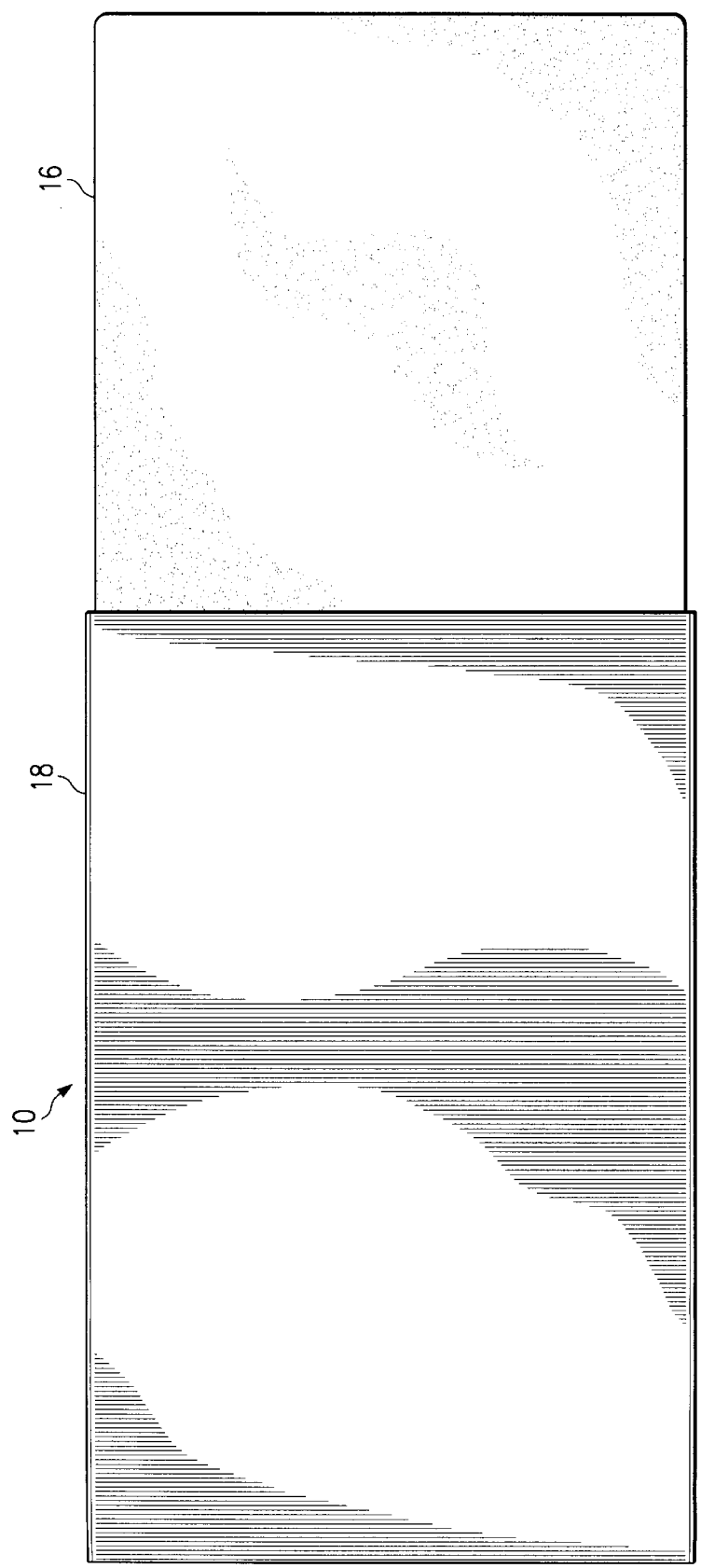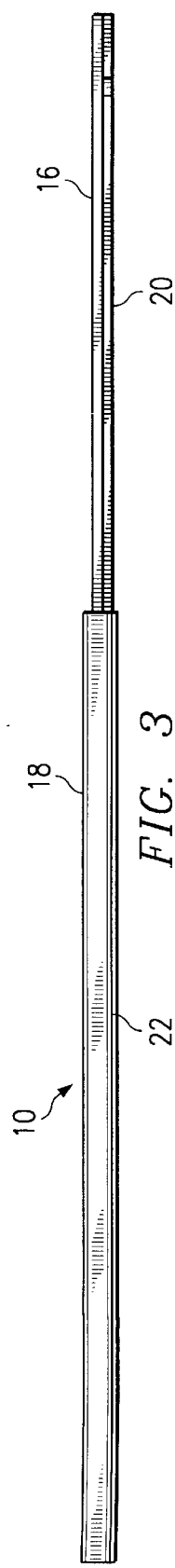

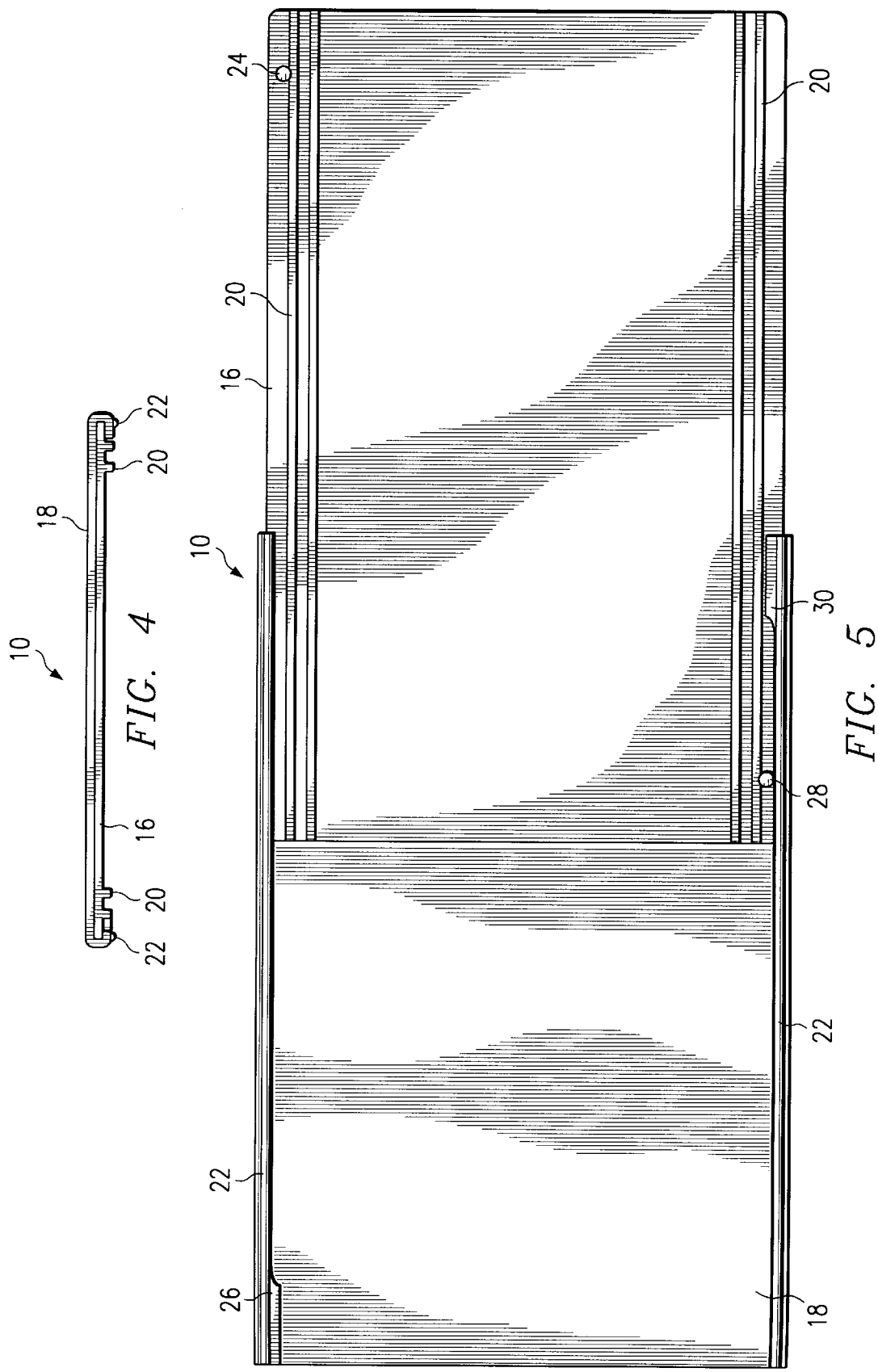

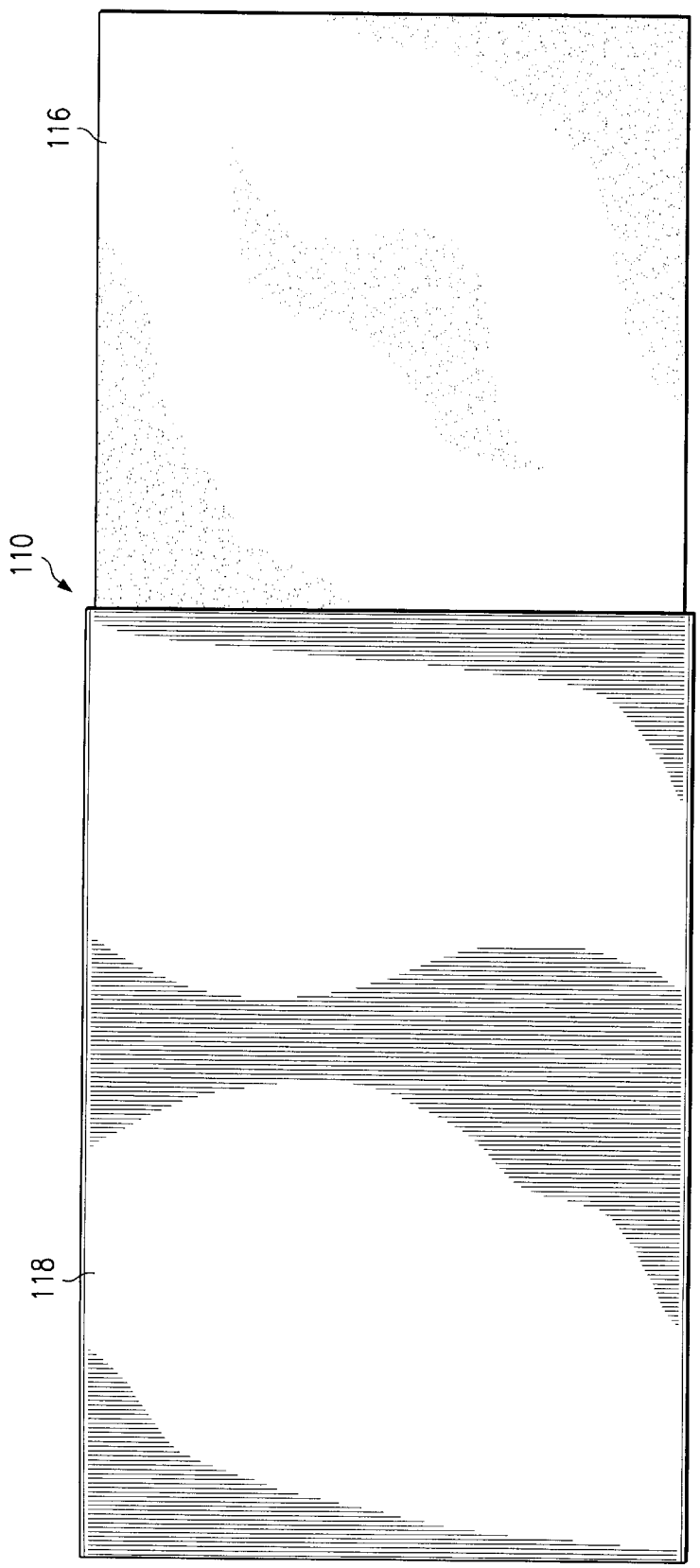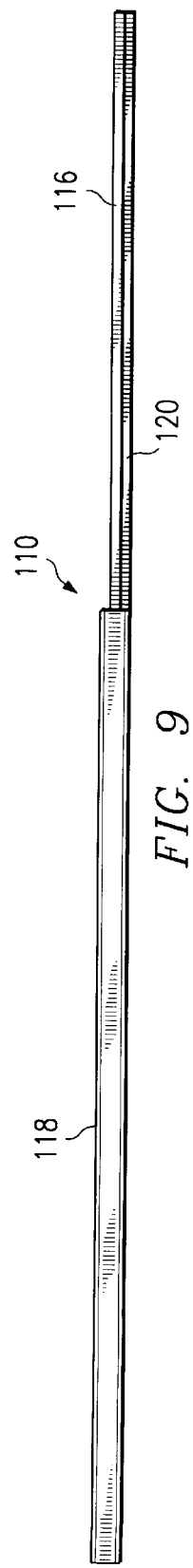
FIG. 8
FIG. 9

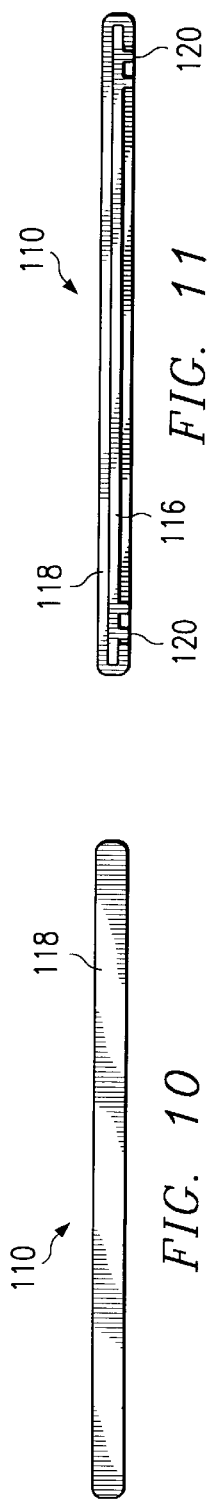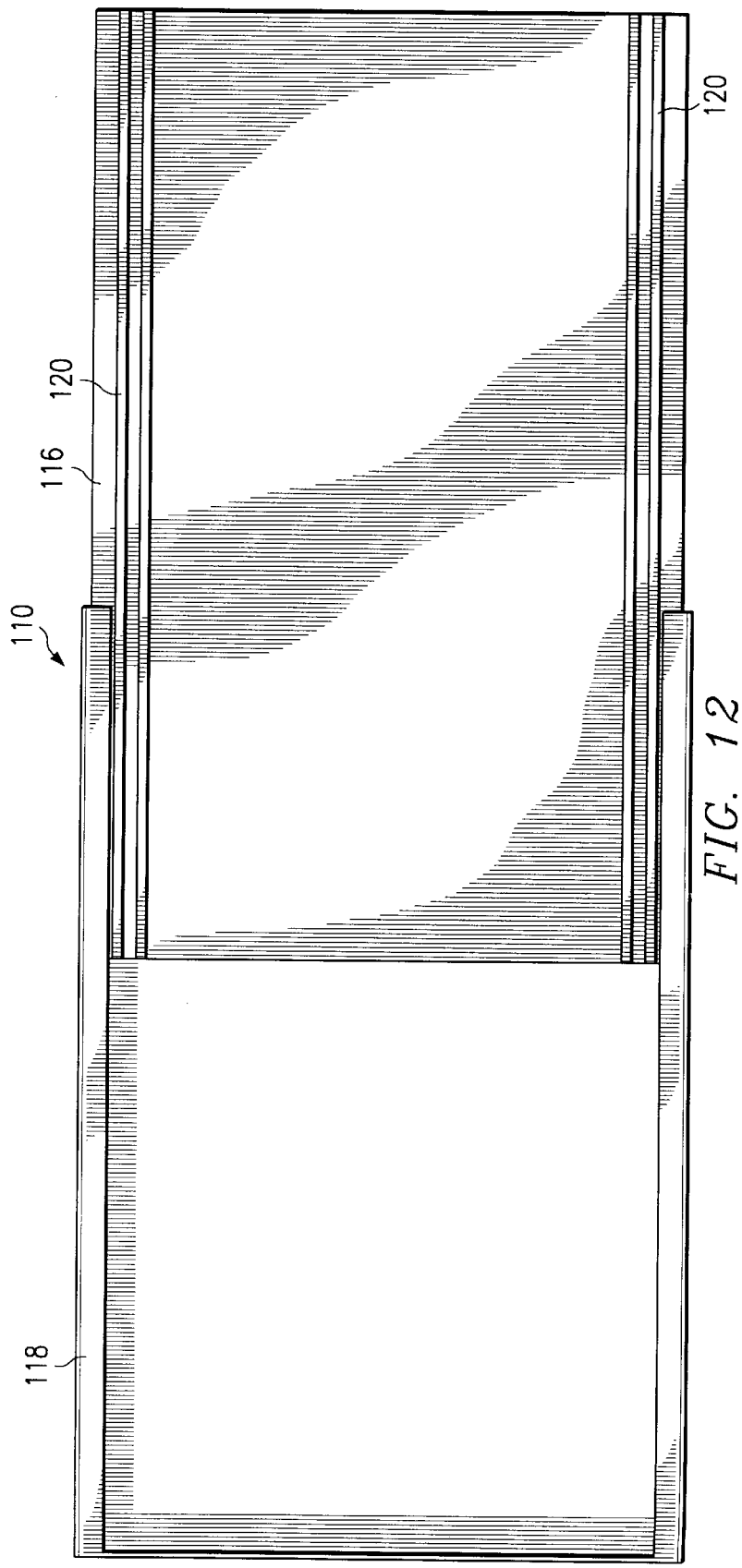

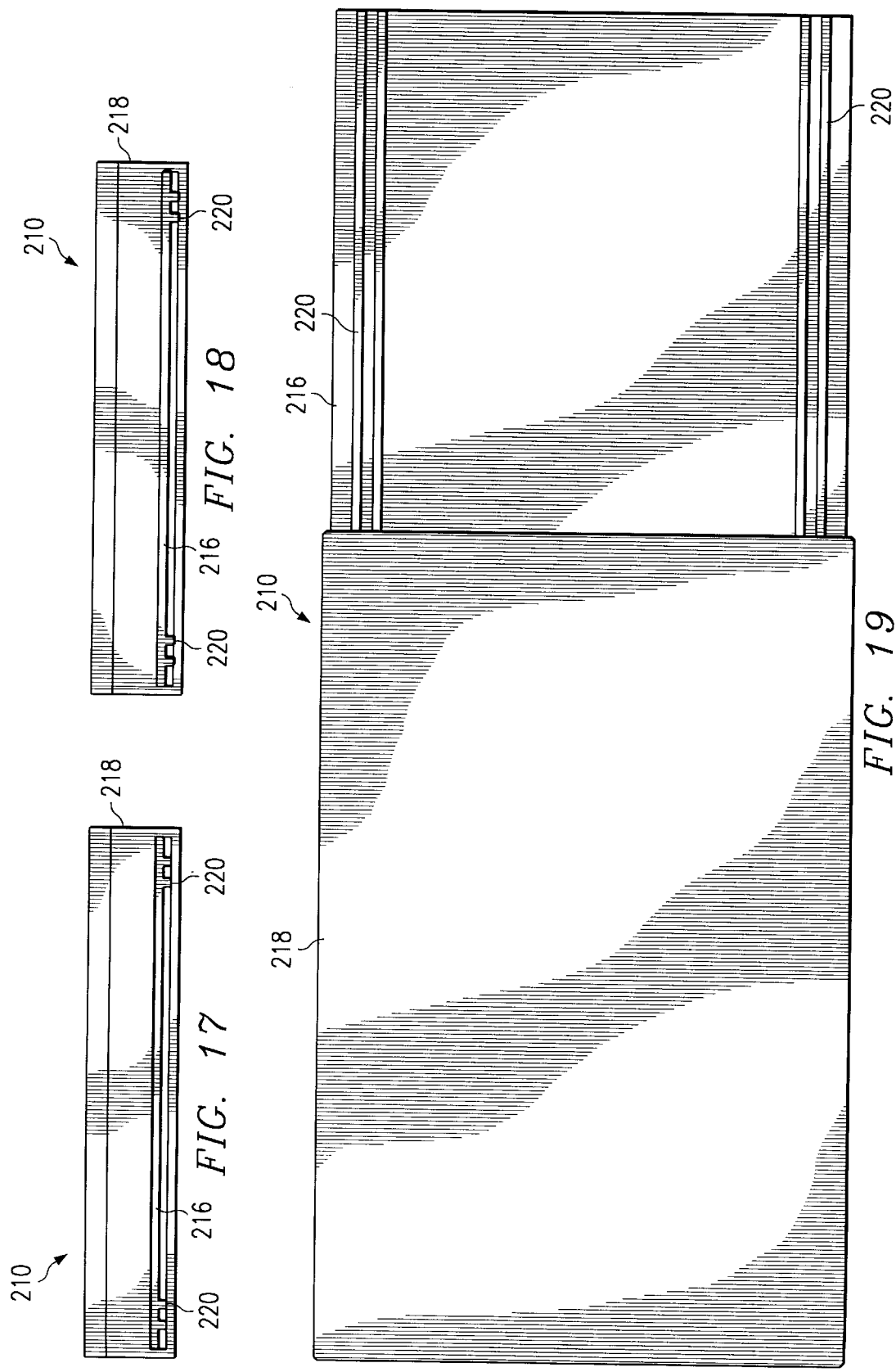

RETRACTABLE SURFACE APPARATUS

CROSS-REFERENCE TO RELATED APPLICATIONS

This application is a continuation-in-part application of Design U.S. patent applications: Ser. No. 29/048,968 entitled NOTEBOOK COMPUTER RETRACTABLE MOUSE PAD CASE, by Ronal E. Wilson (Docket No. 062403.0104), filed on Jan. 16, 1996, now Design U.S. Pat. No. D380,462; Ser. No. 29/045,428 entitled RETRACTABLE MOUSE PAD, by Ronal E. Wilson, (Docket No. 062403.0103), filed on Oct. 19, 1995, now Design U.S. Pat. No. D392,955; and Ser. No. 29/059,130 entitled RETRACTABLE MOUSE PAD WITH BEADS, by Ronal E. Wilson, Docket No. 062403.0106), filed on Aug. 22, 1996 now Design U.S. Pat. No. D398,294.

TECHNICAL FIELD OF THE INVENTION

This invention relates generally to the field of computer peripherals and more particularly to a retractable surface apparatus.

BACKGROUND OF THE INVENTION

Portable computers, such as notebook computers and laptop computers, are becoming more and more prevalent. Portable computers are especially useful to travelers, such as business travelers, for use when away from the home or office. With the proliferation of graphical user interfaces, a corresponding increase in the use of computer pointing devices has also dramatically increased. A computer pointing device may include a computer mouse, a trackball, a touch pad, and the like. The computer pointing devices have taken on increased importance with the growing popularity and usage of operating systems employing graphical user interfaces. For example, WINDOWS 3.1, WINDOWS 95, OS/2, and the Macintosh Operating System. As such, the use of computer pointing devices have also taken on increased importance with respect to the use of portable computers.

The goal of portable computers is to reduce the overall system size while maintaining similar functionality and power of a desktop personal computer. Manufacturers and designers of portable computers have addressed the need to include a pointing device by including built-in trackballs, touch pads, and pointing sticks. A pointing stick is an eraser-sized, rubberized device in the center of the keyboard that may be moved with the fingertip to relocate the cursor on-screen. Unfortunately, users of portable computers have found that these devices do not provide the same functionality and ease-of-use that a traditional, full-sized computer mouse provides. Thus, users of portable computers often desire to use a full-sized mouse with their portable computer. This presents substantial difficulties since a flat surface, with an appropriate texture, is often not available in locations where a portable computer is being used. For example, on an airplane, in an airport, and while sitting in a chair.

Users of portable computers often refer to written material while using their portable computer. Similarly, users often need to take handwritten notes while using a portable computer. This too is often cumbersome and inconvenient when operating a portable computer in its intended environment, such as while sitting in a chair. Another disadvantage of portable computers is that due to their reduction in size, it is inconvenient to operate a portable computer from your lap. This is so because the width of portable computers has been reduced to such a width that a user must place his legs and knees next to one another so that the portable computer will be properly balanced and supported. Unfortunately, this is an uncomfortable sitting position which quickly causes muscle fatigue and can cause muscle spasms, such as back muscle spasms. This presents a serious problems since a user often is forced to remain in this unnatural sitting position for extended periods of time.

Portable computers also suffer the disadvantage of overheating when placed on a soft, "cushiony" surface. Business travelers often use their portable computers while working from their hotel rooms. Users often place the portable computer on a soft surface, such as the hotel bed, while operating the portable computer. This can cause overheating of the portable computer resulting in damage to the portable computer and, in some cases, start a fire.

As mentioned above, with the proliferation of graphical user interfaces, from both operating systems and application programs, the need to use a pointing device, such as a mouse, has become a necessity. This presents problems even for users of desktop computers. Often, users are positioned at a workstation or desk in such a manner that the keyboard must be extended from the workstation to the user. This creates additional space between the user and the user's work surface. This necessitates the need to stretch and reach to locate and operate a mouse. For example, users often use a keyboard tray, drawer, or shelf that allows a keyboard to extend from a user's work surface to the user positioned in a chair. An example is provided in U.S. Pat. Nos. Des. 333,300 and Des. 302,425. A user must then reach to the work surface to use the mouse. This causes various injuries such as back strains, arm and shoulder strains, fatigue, and contributes to workplace injury. Employers and their worker's compensation carriers are very interested in reducing such workplace injuries.

SUMMARY OF THE INVENTION

From the foregoing it may be appreciated that a need has arisen for a retractable surface apparatus that eliminates or reduces the problems described above. In accordance with the present invention, a retractable surface apparatus, for use with either a portable computer or a keyboard of a desktop computer, substantially eliminates and reduces the disadvantages and problems outlined above.

According to an embodiment of the present invention, a retractable surface apparatus is provided that may be positioned on a bottom side of any device such as a portable computer, a keyboard, or a drawer of a computer drawer. The retractable surface apparatus includes a casing and a retractable surface portion. The casing has an opening formed therein with a first end and a second end. The retractable surface portion has a top surface, a bottom surface, a first side edge, a second side edge, a front edge, and a back edge. The retractable surface portion slidably positioned within the opening of the casing such that the retractable surface portion can extend from the opening of the casing through the first end for a predetermined distance to serve as a work surface.

The present invention provides various technical advantages. A technical advantage of the present invention includes the capability to use a full-sized mouse with a portable computer. Another technical advantage of the present invention includes the capability to serve as a writing surface when using a portable computer. Yet another technical advantage of the present invention is the capability to provide a surface that extends a predetermined distance and without becoming detached. Still yet another technical advantage of the present invention includes the capability to position a portable computer in the lap of a user in such a manner that the user can comfortably provide a distance between the user's legs while using a portable computer from a sitting position. Still another technical advantage of the present invention includes the capability to operate a portable computer on a soft, cushion surface without dangerous levels of heat building up within the computer. This may increase the operating life of the portable computer and may prevent a fire. Another technical advantage of the present invention includes the capability to attach the present invention to a keyboard or drawer of a computer drawer, used with a desktop computer, to allow the user to conveniently use a pointing device, such as a full-sized mouse, without having to uncomfortably and strenuously reach. A further technical advantage includes the capability to provide an adjustable width surface to a portable computer to fit various sizes of chairs from an airplane seat to a recliner. Still yet another technical advantage of the present invention includes the capability to attach the retractable surface apparatus to a portable computer such that the retractable surface apparatus is thin enough to allow the portable computer to easily fit within its existing protective carrying case and light enough to not add any significant weight when transporting the portable computer. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which:

FIG. 1 is a perspective view taken from the top, front, and right side of a first embodiment of a retractable surface apparatus with a retractable surface portion extended and shown attached to the bottom side of a portable computer;

FIG. 2 is a top plan view of the first embodiment of the retractable surface apparatus;

FIG. 3 is a front elevational view of the first embodiment of the retractable surface apparatus, the rear elevational view is a mirror image;

FIG. 4 is a right side elevational view of the first embodiment of the retractable surface apparatus, the left side elevational view is a mirror image;

FIG. 5 is a bottom plan view of the first embodiment of the retractable surface apparatus with the retractable surface portion partially extended;

FIG. 8 is a top plan view of the second embodiment of the retractable surface apparatus;

FIG. 9 is a front elevational view of the second embodiment of the retractable surface apparatus, the opposite side being a mirror image;

FIG. 10 is a left side elevational view of the second embodiment of the retractable surface apparatus;

FIG. 11 is right side elevational view of the second embodiment of the retractable surface apparatus;

FIG. 12 is a bottom plan view of the second embodiment of the retractable surface apparatus showing the retractable surface portion partially extended;

FIG. 17 is a left side elevational view of the third embodiment of the retractable surface apparatus;

FIG. 18 is a right side elevational view of the third embodiment of the retractable surface apparatus;

FIG. 19 is a bottom plan view of the third embodiment of the retractable surface apparatus showing the retractable surface portion partially extended.

DETAILED DESCRIPTION OF THE INVENTION

Figure 6:
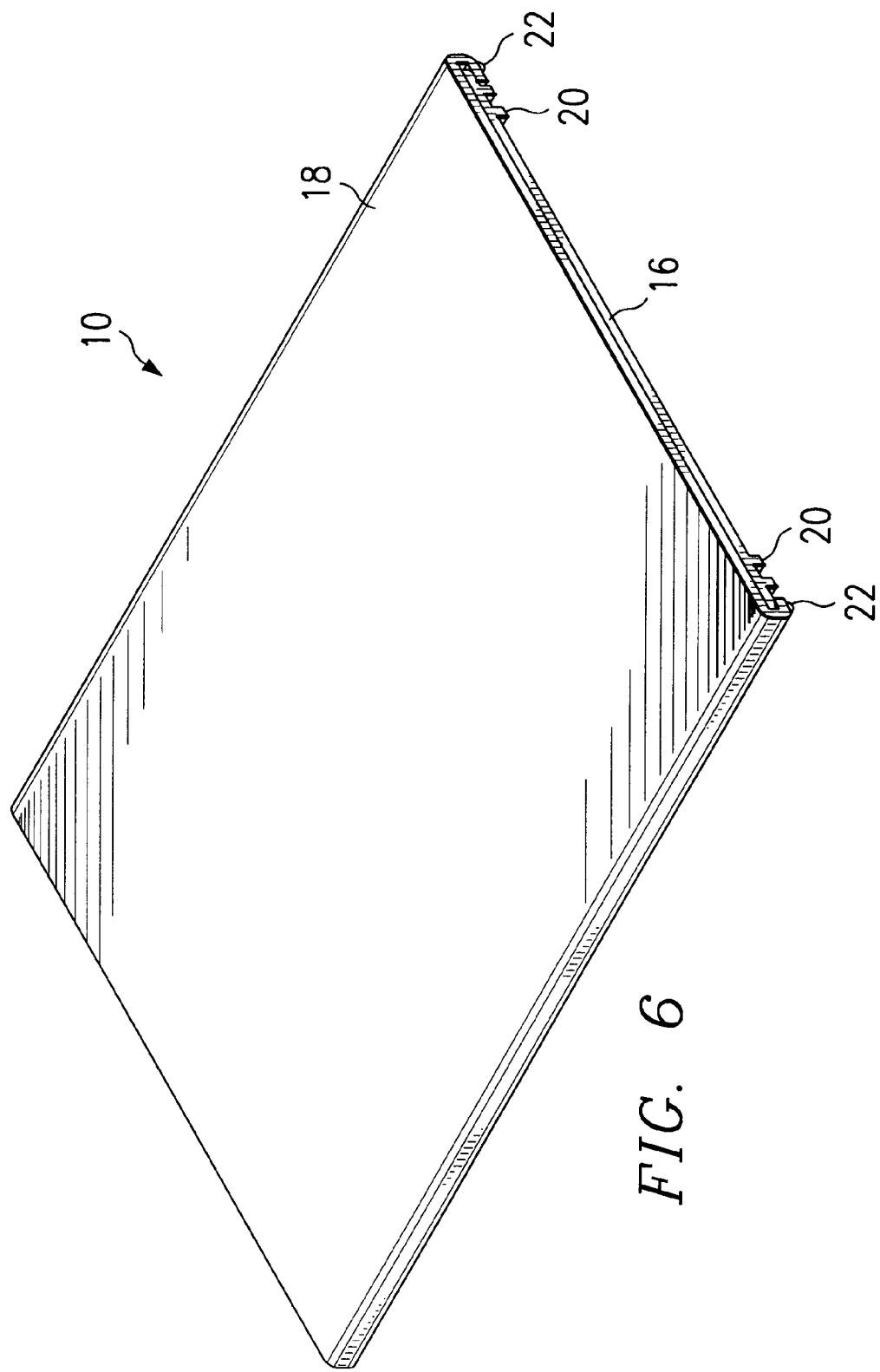
FIG. 6, is a perspective view, of the first embodiment of the retractable surface apparatus, taken from the top, front, and right side, and with the retractable surface portion fully retracted.

FIG. 1 is perspective view taken from the top, front and right side of a first embodiment of a retractable surface apparatus 10 shown attached to the bottom side of a portable computer 12. Portable computer 12 may be any portable computer such as a notebook computer or a laptop computer. A full-sized mouse 14 is shown coupled to the portable computer 12 and residing on a top or upper surface of a retractable surface portion 16 of retractable surface apparatus 10. In an alternative embodiment, portable computer 12 may be a keyboard of a desktop computer and thus FIG. 1 would illustrate a first embodiment of retractable surface apparatus 10 attached to the bottom side of the keyboard used with a desktop computer. In another alternative embodiment, portable computer 12 may be a drawer of a computer drawer and thus FIG. 1 would illustrate a first embodiment of retractable surface apparatus 10 attached to the bottom side of the drawer of a computer drawer.

A retractable surface portion 16 may slide into and out of an opening in a casing 18 of retractable surface apparatus 10 for a predetermined distance without becoming detached from casing 18. Retractable surface portion 16, in this embodiment, is generally rectangular in shape and provides a stable surface that may be provided in a friction fit within an opening of casing 18 to provide added stability. Retractable surface portion 16 may include a textured surface so that mouse 14 may be slidably moved on the top or upper surface of retractable surface portion 16 without undue slippage. Retractable surface portion 16 may be retracted to the predetermined distance through a first end of the opening of casing 18, as illustrated, or through a second end of the opening of casing 18, which is also the left side of portable computer 12. The bottom of retractable surface portion 16 may contain bottom railings 20, as partially illustrated in FIG. 1.

Retractable surface portion 16 includes a top surface, a bottom surface, a first side edge, a second side edge, a front edge, and a back edge. The top surface, the first side edge, and the front side edge are visible in FIG. 1. Retractable surface portion 16 is slidably positioned within the opening of casing 10 such that retractable surface portion 16 may extend from the first end of the opening of casing 18 for a predetermined distance to serve as a work surface. Retractable surface portion 16 may serve as a mouse pad, a writing surface, or a structural support so that a user of portable computer 12 and retractable surface apparatus 10 may comfortably balance and support portable computer 12 while residing in a sitting position. This allows the user to comfortably position his or her legs in a position that does not require the legs or knees to be positioned uncomfortably or awkwardly close to each other.

As mentioned above, retractable surface apparatus 10 may be attached to the underside of a keyboard, such as the keyboard of a desktop computer. In such a case, retractable surface apparatus 10 allows a user to conveniently access mouse 14 positioned on retractable surface portion 16. This prevents the user from having to excessively extend and reach to a separate work surface to locate and operate the pointing device or mouse.

FIG. 2 is a top plan view of the first embodiment of retractable surface apparatus 10. As illustrated, retractable surface portion 16 may extend from the first end of the opening of casing 18. The exposed corners of retractable surface portion 16 may be provided as a sharp corner or, preferably, as a rounded corner.

FIG. 3 is a front elevational view of the first embodiment of the retractable surface apparatus 10 showing the front edge of retractable surface portion 16. The rear elevational view of retractable surface apparatus 10 is a mirror image of the front elevational view. This view of the first embodiment of the retractable surface apparatus 10 illustrates that casing 18 is thicker than retractable surface portion 16. Also, bottom railings 20 are illustrated more fully in FIG. 3 and may be provided along the full length of retractable surface portion 16 as illustrated in this embodiment. The bottom railings, in the first embodiment of retractable surface apparatus 10, are not fully covered by the bottom portion of casing 18. This is illustrated more fully in FIGS. 4 and 5. As such, the bottom railings provide a vent or volume of air that allows any heat generated between an attached portable computer 12 to be properly vented. This prevents any dangerous heat build-up that may occur when portable computer 12 is placed directly on a soft, "cushiony" surface, such as a hotel bed. FIG. 3 also illustrates a bead line 22 that extends the full length of the bottom portion of casing 18. Bead line 22 serves as the contact surface of retractable surface apparatus 10 when it contacts another object or surface.

FIG. 4 is a right side elevational view of the first embodiment of retractable surface apparatus 10 showing the first end of the opening of casing 18 and the first side edge of retractable surface portion 16. The left side elevational view of retractable surface apparatus 10 is a mirror image and hence illustrates the second end of the opening of casing 18 and the second side edge of retractable surface portion 16. FIG. 4 illustrates the interconnection of retractable surface portion 16 and casing 18. As shown, casing 18 extends around the top surface, the front edge, the back edge, and a portion of the bottom surface of retractable surface portion 16 but does not extend past bottom railings 20. Hence, bottom railings 20 and the remaining bottom surface of retractable surface portion 16 may provide the desired ventilation.

FIG. 4 also illustrates bead lines 22. As mentioned previously, bead lines 22 are provided on the bottom surface of the portion of casing 18 that extends around the edges of retractable surface portion 16. As shown, bead lines 22 are the lower most portion of retractable surface apparatus 10 and thus will make contact with any surface or object that they are provided against. Bead lines 22 provide an anti-skid property to prevent retractable rue surface apparatus 10, and any attached portable computer 12 or keyboard, from sliding. Bead lines 22 may be fabricated using silicon, or any other suitable material, such as a plastic, that provides the anti-skid property. Bead lines 22 also provide added stability and prevents retractable surface apparatus 10 from rocking when placed on another surface. Bead lines 22 are especially useful to prevent portable computer 12 from slipping off a user's lap when used from a sitting position.

FIG. 5 is a bottom plan view of the first embodiment of retractable surface apparatus 10 and is illustrated with retractable surface portion 16 shown partially extended. The bottom surface of retractable surface portion 16 is shown in more detail. FIG. 5 illustrates further elements of retractable surface apparatus 10 such as a retractable surface portion stop 24, a casing stop 26, a retractable surface portion stop 28, and a casing stop 30.

Retractable surface portion stop 24 may be formed either separately from retractable surface portion 16 or as part of retractable surface portion 16. Retractable surface portion stop 24 matches with casing stop 26 of casing 18 when retractable surface portion 16 is fully extended in the opposite direction as illustrated in FIG. 5. Casing stop 26 is the portion of casing 18 that extends around retractable surface portion 16 and prevents retractable surface portion 16 from extending too far in the opposite direction as illustrated in FIG. 5. The length of casing stop 26 may be set at any length to allow retractable surface portion 16 to extend to a desirable length or predetermined distance.

Retractable surface portion stop 28, and associated casing stop 30, serve the same functions as retractable surface portion stop 24 and casing stop 26, except in the opposite direction. As illustrated, if retractable surface portion 16 were extended further in the direction shown, retractable surface portion stop 28 would ultimately contact casing stop 30, thus preventing retractable surface portion 16 from extending any further. The length of casing stop 30 may also be adjusted, as discussed above with respect to casing stop 26.

In an alternative arrangement, casing stop 30 may not extend to the first end of the opening of casing 18 and casing stop 26 may not extend to the second end of the opening of casing 18, but instead, casing stop 30 and casing stop 26 may be provided as tabs that perform the same or similar functions but do not extend to the end of their respective opening.

Bead lines 22 and bottom railings 20 are positioned as shown. In alternative embodiments, bottom railings 20 and bead lines 22 may be provided at variable lengths that do not extend the entire length of retractable surface portion 16 and casing 18. Similarly, bottom railings 20 and bead lines 22 may be provided as a plurality of segments.

FIG. 6 is a perspective view, of the first embodiment of retractable surface apparatus 10, taken from the top, front, and right side, and with retractable surface portion 16 fully retracted within the opening of casing 18. In such a state, retractable surface apparatus 10 provides a very thin or narrow profile, thus minimizing its affect on the overall thickness of portable computer 12 which allows portable computer 12 to be used in existing carrying cases without alteration. Retractable surface apparatus 10 may be constructed of virtually any material but preferably will be constructed of either a soft or hard plastic using injection molding techniques. The top or upper surface of casing 18 may attach to the bottom surface of portable computer 12 or a keyboard using any available adhesive or fastener such as a hook and loop fastener like the VELCRO brand, adhesive tape, screw fasteners, and the like.

Figure 7:
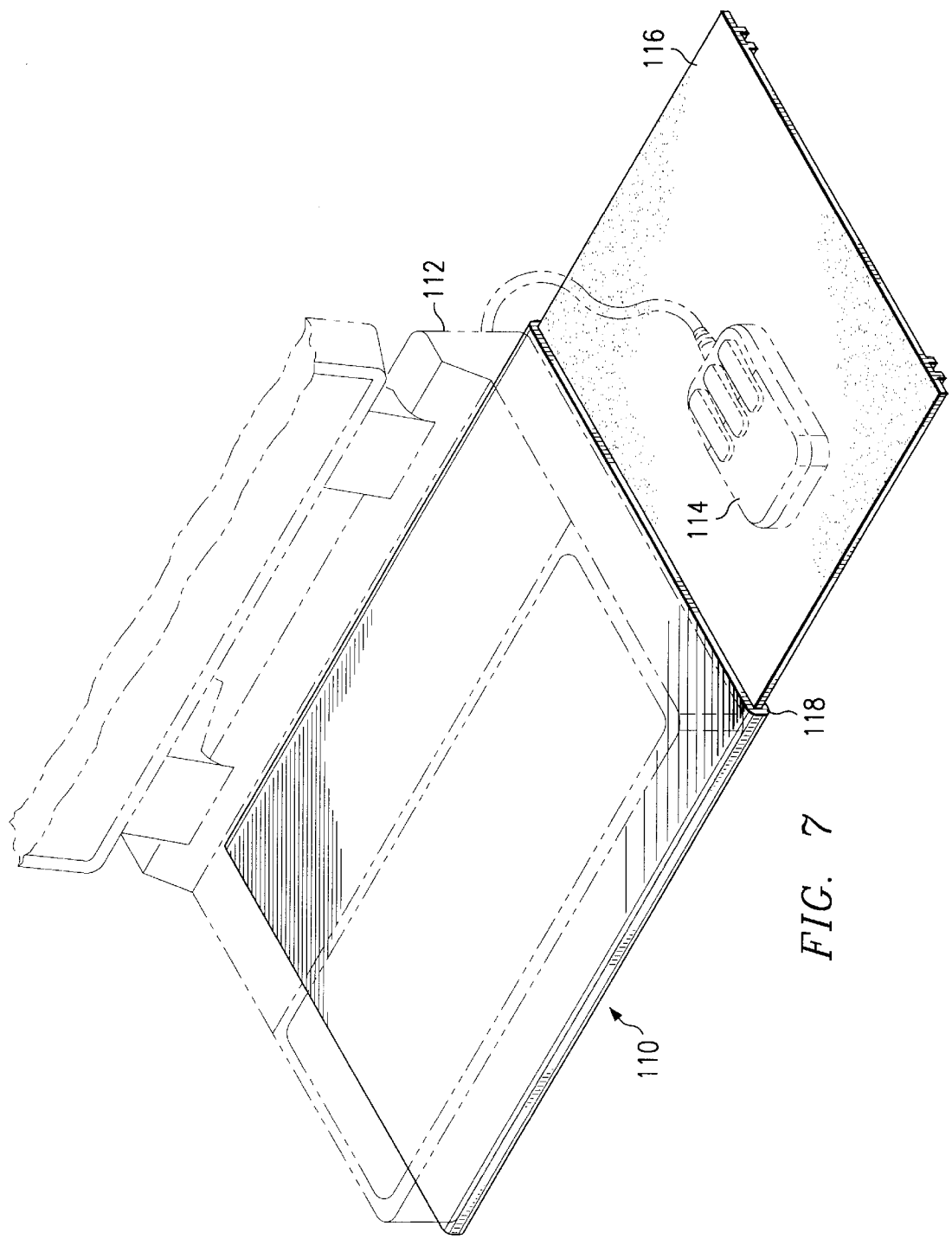
FIG. 7 is a perspective view taken from the top, front, and right side of a second embodiment of the retractable surface apparatus with a retractable surface portion extended, and shown attached to the bottom side of a portable computer.

FIG. 7 is a perspective view taken from the top, front, and right side of a second embodiment of retractable surface apparatus 110. It should be noted that the description accompanying FIGS. 1 through 6 generally applies equally to FIGS. 7 through 13 except where specifically noted. As such, much of the previous description will not be repeated and the reference numerals provided with FIGS. 7 through 13 correspond to those previously given in the descriptions accompanying FIGS. 1 through 6 except that a first digit of "1" has been added. For example, the first embodiment of retractable surface apparatus 10 is illustrated in FIGS. 1 through 6 while the second embodiment of retractable surface apparatus 110 is illustrated in FIGS. 7 through 13. The description of FIGS. 7 through 13 will primarily focus on the differences between the first embodiment of retractable surface apparatus 10 and the second embodiment of retractable surface apparatus 110.

FIG. 8 is a top plan view of the second embodiment of retractable surface apparatus 110. Retractable surface portion 116 is provided with square corners and a textured top or upper surface. A mouse pad may be located on the top surface of retractable surface portion 116.

FIG. 9 is a front elevational view of the second embodiment of retractable surface apparatus 110. The opposite side of retractable surface apparatus 110 is a mirror image. Bottom railings 120 are also illustrated in FIG. 9 and may be configured as a pair of single railings, a pair of double railings, or a plurality of railings positioned on the bottom side of retractable surface portion 116.

FIG. 10 is a left side elevational view of the second embodiment of retractable surface apparatus 110. In this view, only casing 118 is revealed. As such, the second end of the opening of casing 118 is closed, thus preventing retractable surface portion 116 from extending outwardly from this end.

FIG. 11 is a right side elevational view of the second embodiment of retractable surface apparatus 110. This end of retractable surface apparatus 110 allows retractable surface portion 116 to extend outwardly from casing 118. Although the description of FIG. 11 refers to this as a right side elevational view, it should be understood that retractable surface apparatus 110 may be positioned in the opposite direction which would allow retractable surface portion 116 to extend outwardly from the other end. Thus, retractable surface apparatus 110 may be positioned by the user as desired. Normally, a left-handed user would position retractable surface apparatus 110 such that retractable surface portion 116 could be extended from the left side of portable computer 12 when facing portable computer 12. Conversely, a right-handed user may position retractable surface apparatus 110 such that retractable surface portion 116 could extend from the right side of portable computer 12 when facing portable computer 12 as a user.

FIG. 12 is a bottom plan view of the second embodiment of retractable surface apparatus 110 showing retractable surface portion 116 partially extended. In this embodiment, bottom railings 120 are provided as two pair of bottom railings extending generally along the length of retractable surface portion 116. In alternative embodiments, bottom railings 120 may be provided at a ninety-degree angle from bottom railings 120 as illustrated in FIG. 12. Casing 118 is also illustrated with one end being closed and the opposite end being open so that retractable surface portion 116 may extend outwardly in one direction.

Figure 13:
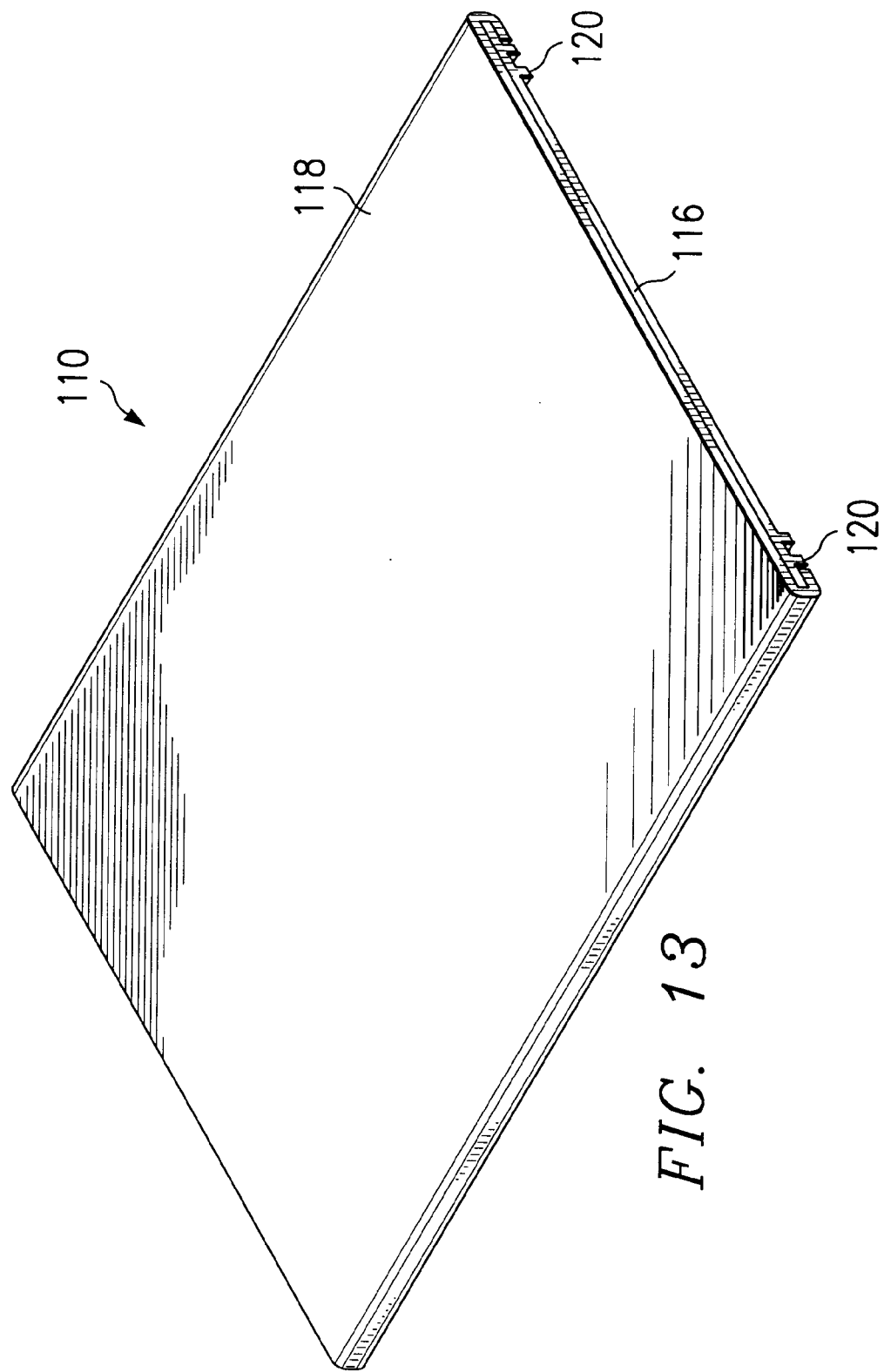
FIG. 13 is a perspective view taken from the top, front, and right side of the second embodiment of the retractable surface apparatus, and with the retractable surface portion fully retracted.

FIG. 13 is a perspective view taken from the top, front, and right side of the second embodiment of retractable surface apparatus 110. Retractable surface portion 116 is shown fully retracted. Just as with the first embodiment of retractable surface apparatus 10, retractable surface apparatus 110 may be constructed from virtually any material, including wood and plastic. Preferably, retractable surface apparatus 110 will be constructed using injection molding techniques.

Figure 14:
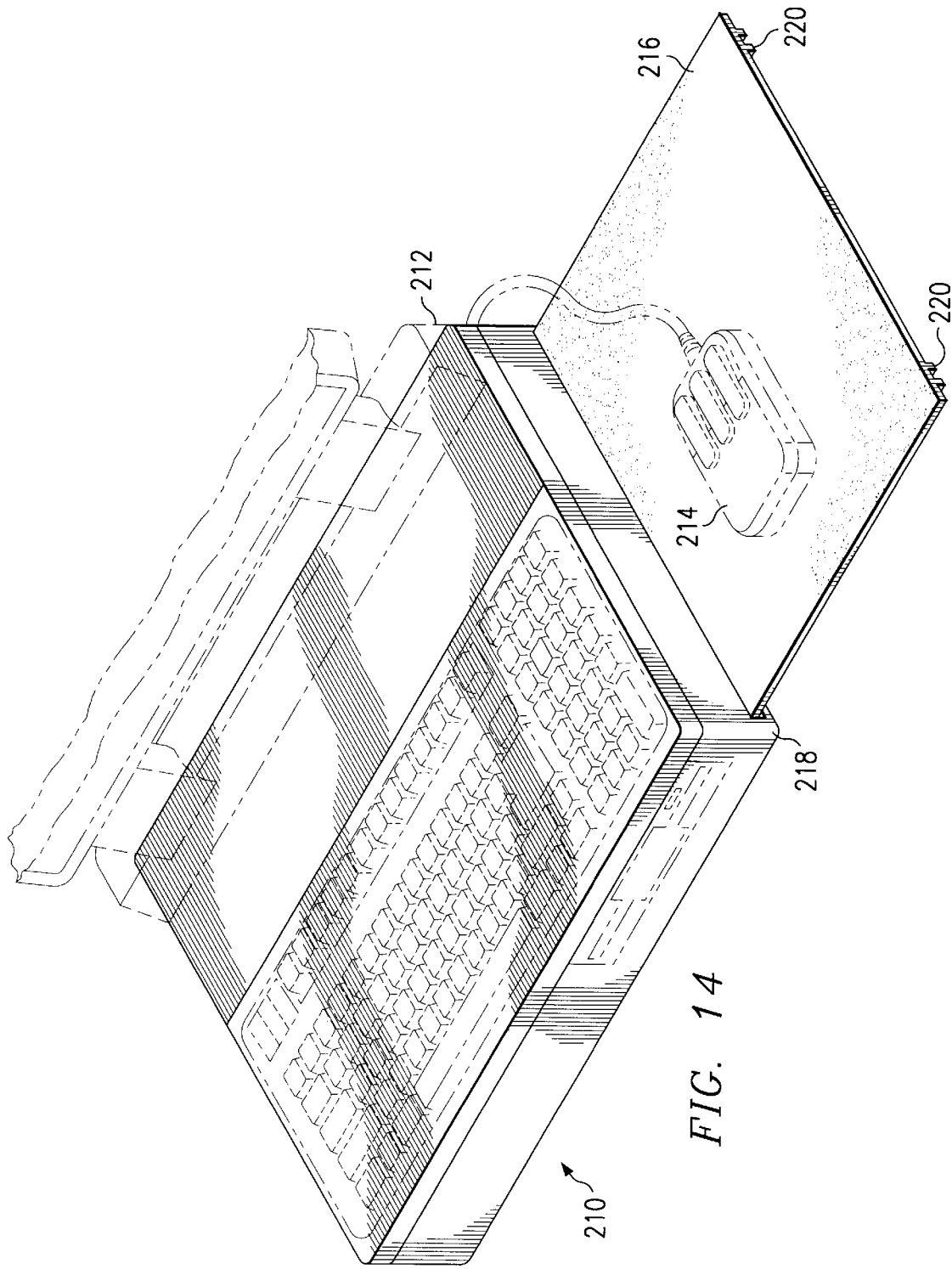
FIG. 14 is a perspective view taken from the top, front, and right side of a third embodiment of the retractable surface apparatus, with a retractable surface portion extended, that is implemented into the case of a portable computer.

FIG. 14 is a perspective view taken from the top, front, and right side of a third embodiment of a retractable surface apparatus 210, with a retractable surface portion 216 extended. In this embodiment, retractable surface apparatus 210 is implemented and configured to serve as the case or outer shell of a portable computer 212. Just as with the second embodiment of retractable surface apparatus 110, the description accompanying FIGS. 1 through 6 generally apply equally to FIGS. 14 through 20 except where specifically noted. As such, much of the previous description will not be repeated and the reference numerals provided with FIGS. 14 through 20 correspond generally to those previously given in the description accompanying FIGS. 1 through 6 except that a first digit of "2" has been added.

As shown, portable computer 212 includes a casing 218 that serves as the casing of portable computer 212 as well as the casing of retractable surface apparatus 10. Retractable surface portion 216 may be extended outwardly from the opening in casing 218. A full-sized mouse 214 is illustrated for use with portable computer 212. Also, bottom railings 220 are shown and positioned on the bottom surface of retractable surface portion 216.

Figure 15:
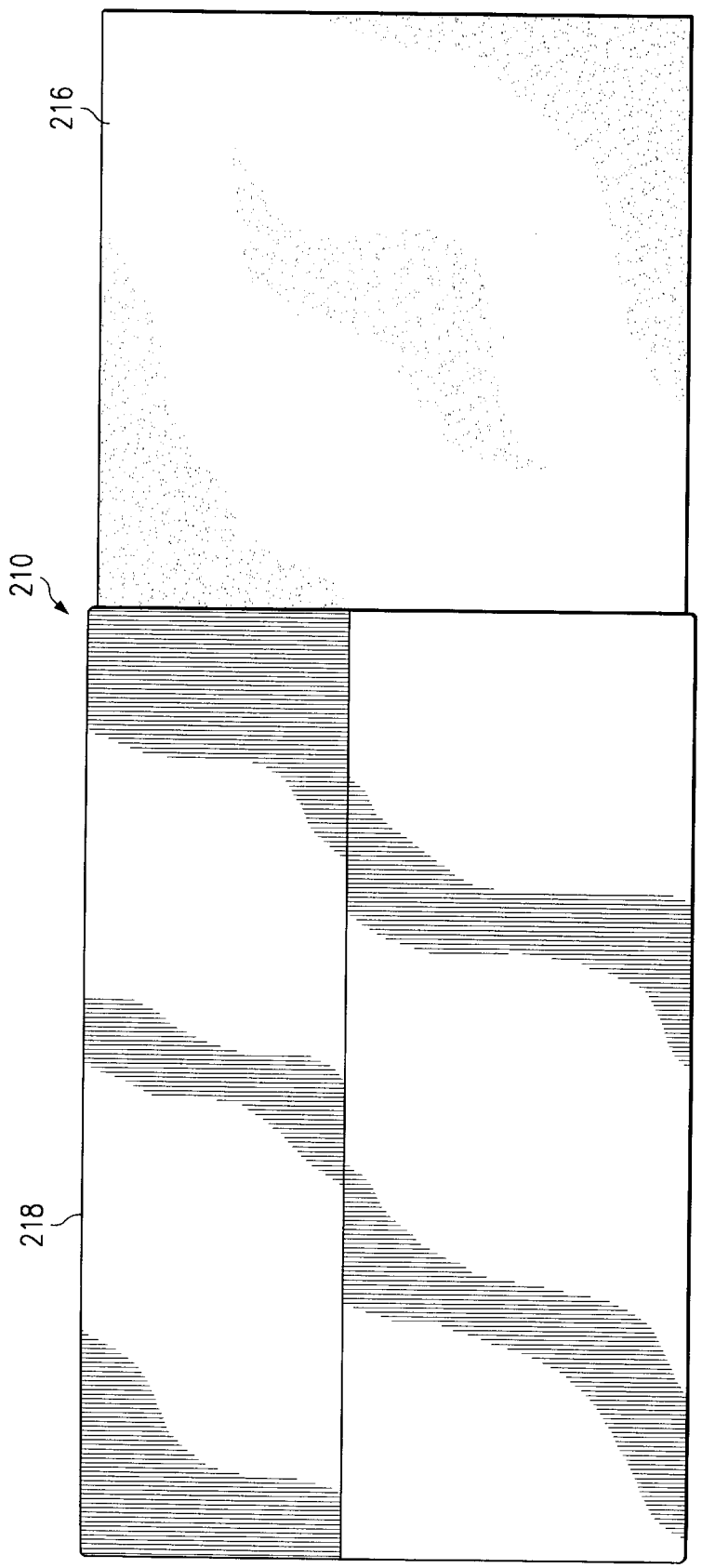
FIG. 15 is a top plan view of the third embodiment of the retractable surface apparatus.

FIG. 15 is a top plan view of the third embodiment of retractable surface apparatus 210. Retractable surface portion 216 is shown partially extended from casing 218. Casing 218 may be provided in any shape required to serve as a casing of portable computer 212 and to include an opening so that retractable surface portion 216 may be slidably positioned. In an alternative embodiment, casing 218 may serve as the casing of a keyboard such that retractable surface portion 216 could be extended from underneath or from within casing 218 to provide a surface to the side of a keyboard. The surface could then be used as a mouse pad or as a writing surface.

Figure 16:
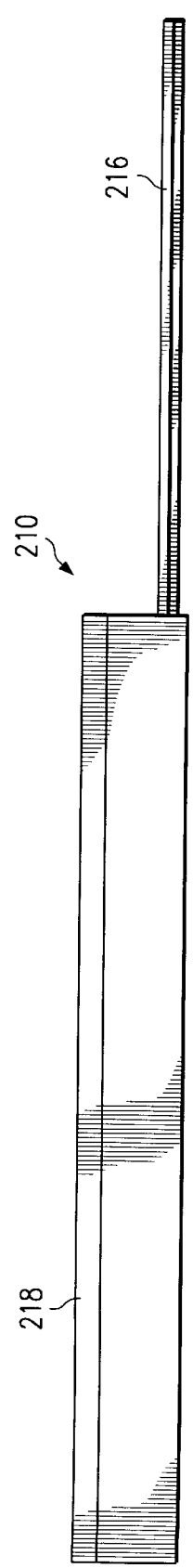
FIG. 16 a front elevational view of the third embodiment of the retractable surface apparatus, the opposite side being a mirror image.

FIG. 16 is a front elevational view of the third embodiment of retractable surface apparatus 210. The opposite side of retractable surface apparatus 210 is a mirror image. In this embodiment, retractable surface portion 216 does not serve as the bottom of retractable surface apparatus 210 when fully retracted. Instead, casing 218 will generally serve as the bottom portion of retractable surface apparatus 210. In one embodiment, not illustrated in FIG. 16, a bead line may be provided on the bottom portion of casing 218, similar to bead lines 22 of FIG. 3.

FIG. 17 is a left side elevational view of the third embodiment of retractable surface apparatus 210. In this embodiment, the opening in casing 218, unlike the opening in casing 118 of retractable surface apparatus 110 as shown in FIG. 10, is open. Retractable surface portion 216 is shown positioned within the opening of casing 218 along with bottom railings 220. As such, retractable surface portion 216 may be extended outwardly through the opening in casing 218. In an alternative embodiment, casing 218 may provide a closed end, such as casing 118 of FIG. 10.

FIG. 18 is a right side elevational view of the third embodiment of retractable surface apparatus 210. The illustration in FIG. 18 is essentially identical to the illustration in FIG. 17 except that it is a view from the opposite end.

FIG. 19 is a bottom plan view of the third embodiment of retractable surface apparatus 210 showing retractable surface portion 216 partially extended. Except for the fact that casing 218 also serves as the casing or shell body of portable computer 212, the illustration of the third embodiment of retractable surface apparatus 210 is similar to the second embodiment of retractable surface apparatus 110 as illustrated in FIG. 12. One other difference is that the bottom portion of casing 118 of FIG. 12 does not extend completely around retractable surface portion 116 unlike casing 218 of FIG. 19. In an alternative embodiment of casing 218, the bottom portion of casing 218 may not extend all the way around retractable surface portion 216 and thus will leave a portion of retractable surface portion 216 exposed. One implementation of bottom railings 220 is also illustrated in FIG. 19.

Figure 20:
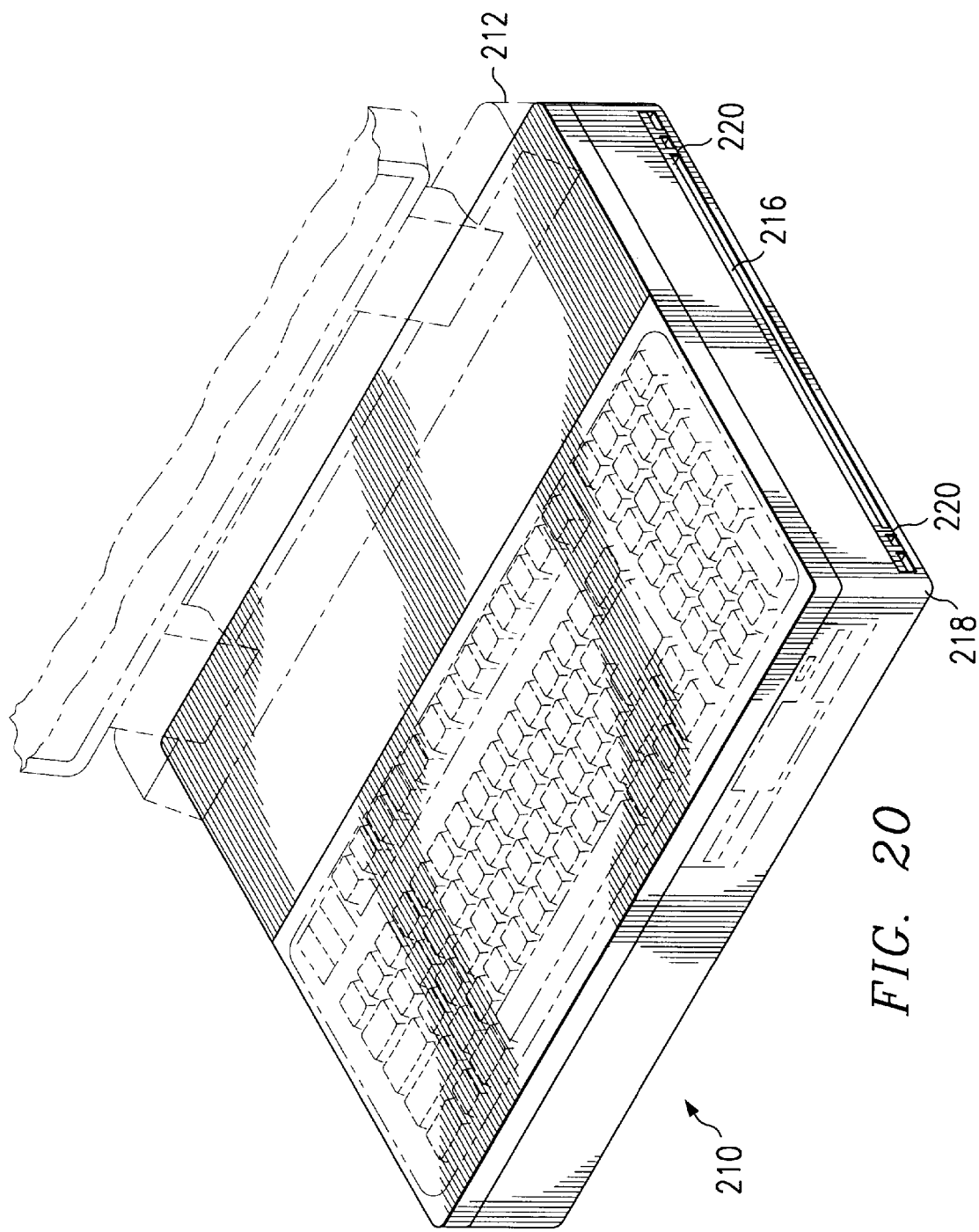
FIG. 20 is a perspective view taken from the top, front, and right side of the third embodiment of the retractable surface apparatus showing the retractable surface portion fully retracted.

FIG. 20 is a perspective view taken from the top, front, and right side of the third embodiment of retractable surface apparatus 210 as implemented as part of portable computer 212. In this illustration, retractable surface portion 216 is shown fully retracted and positioned within casing 218. The illustration in FIG. 20 is similar to that of FIG. 14 except that retractable surface portion 216 is fully retracted. Bottom railings 220 are also shown positioned within casing 218. Casing 218 may be fabricated using any known or available technique for fabricating the casing or outer shell of a portable computer. These are generally constructed from sturdy or rugged plastics. Similarly, retractable surface portion 216 may be constructed from plastic, such as by using injection molding techniques.

Thus, it is apparent that there has been provided, in accordance with the present invention, a retractable surface apparatus that satisfies the advantages set forth above. Although the preferred embodiment has been described in detail, it should be understood that various changes, substitutions, and alterations can be made herein without departing from the scope of the present invention. For example, although not shown, the present invention may be implemented with a desktop keyboard. Other examples of changes, substitutions, and alterations are readily ascertainable by one skilled in the art and could be made without departing from the spirit and scope of the present invention as defined by the following claims.

What is claimed is:

1. A retractable surface apparatus for positioning on a bottom side of a device such as a portable computer, a keyboard, or a drawer of a computer drawer, the retractable surface apparatus comprising:

a casing having an opening formed therein, the opening having a first end and a second end; and a retractable surface portion having a top surface, a bottom surface, a first side edge, a second side edge, a front edge, and a back edge, the retractable surface portion slidably positioned within the opening of the casing such that the retractable surface portion is operable to extend from the opening of the casing through the first end for a predetermined distance, the predetermined distance greater than half the length of the front edge, and wherein the retractable surface portion is further operable to extend from the opening of the casing through the second end for the predetermined distance.

2. The retractable surface apparatus of claim 1, wherein the opening of the casing is formed around the top surface, the front edge, and the back edge of the retractable surface portion.

3. The retractable surface apparatus of claim 2, further comprising:

a casing stop formed on the portion of the casing that is formed around the front edge of the retractable surface portion; and a retractable surface portion stop formed on the retractable surface portion, wherein the casing stop is positioned next to the retractable surface portion stop when the retractable surface portion is extended the predetermined distance.

4. The retractable surface apparatus of claim 3, wherein the casing stop is formed on the portion of the casing that is formed around the front edge of the retractable surface portion and is positioned closer to the first end, relative to the first end and the second end.

5. The retractable surface apparatus of claim 1, wherein the opening of the casing is not formed completely around the bottom surface of the retractable surface portion.

6. The retractable surface apparatus of claim 1, wherein the retractable surface apparatus is substantially flat.

7. The retractable surface apparatus of claim 1, wherein the top surface of the retractable surface portion serves as a mouse pad.

8. The retractable surface apparatus of claim 1, wherein the top surface of the retractable surface portion includes a textured surface to allow a pointing device to rotate.

9. The retractable surface apparatus of claim 1, further comprising a mouse pad positioned on the top surface of the retractable surface.

10. The retractable surface apparatus of claim 1, wherein the retractable surface apparatus is positioned on a bottom surface of the portable computer and the retractable surface apparatus is substantially thinner than a thickness of the portable computer.

11. The retractable surface apparatus of claim 1, further comprising a bead line positioned on the bottom surface of the retractable surface portion.

12. The retractable surface apparatus of claim 1, further comprising a bead line positioned on a bottom surface of the casing.

13. The retractable surface apparatus of claim 1, further comprising a bottom railing positioned on the bottom surface of the retractable surface portion.

14. The retractable surface apparatus of claim 1, wherein the predetermined distance is greater than eighty percent of the length of the front edge.

15. A retractable surface apparatus that serves as the casing of a portable computer, the retractable surface apparatus comprising:

a casing formed to serve as the shell of the portable computer, the casing having an opening with a first end and a second end; and a retractable surface portion having a top surface, a bottom surface, a first side edge, a second side edge, a front edge, and a back edge, the retractable surface portion slidably positioned within the opening of the casing such that the retractable surface portion is operable to extend from the opening of the casing through the first end for a predetermined distance, the predetermined distance greater than half the length of the front edge, and wherein the retractable surface portion is further operable to extend from the opening of the casing through the second end for the predetermined distance.

16. A retractable surface apparatus that serves as the casing of a keyboard, the retractable surface apparatus comprising:

a casing formed to serve as the shell of the keyboard, the casing having an opening with a first end and a second end; and a retractable surface portion having a top surface, a bottom surface, a first side edge, a second side edge, a front edge, and a back edge, the retractable surface portion slidably positioned within the opening of the casing such that the retractable surface portion is operable to extend from the opening of the casing through the first end for a predetermined distance, the predetermined distance greater than half the length of the front edge, and wherein the retractable surface portion is further operable to extend from the opening of the casing through the second end for the predetermined distance.

* * * * *